(12) United States Patent
Hayashi

(10) Patent No.: US 9,133,558 B2
(45) Date of Patent: Sep. 15, 2015

(54) METHOD FOR PRODUCING ANODIZED FILM

(75) Inventor: Hidekazu Hayashi, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 102 days.

(21) Appl. No.: 13/877,182

(22) PCT Filed: Oct. 6, 2011

(86) PCT No.: PCT/JP2011/073109
§ 371 (c)(1),
(2), (4) Date: Apr. 1, 2013

(87) PCT Pub. No.: WO2012/046808
PCT Pub. Date: Apr. 12, 2012

(65) Prior Publication Data
US 2013/0206600 A1 Aug. 15, 2013

(30) Foreign Application Priority Data

Oct. 8, 2010 (JP) .................................. 2010-228328

(51) Int. Cl.
*C25D 1/08* (2006.01)
*C25D 11/04* (2006.01)
(Continued)

(52) U.S. Cl.
CPC .............. *C25D 1/08* (2013.01); *C23C 14/0005* (2013.01); *C23C 14/185* (2013.01);
(Continued)

(58) Field of Classification Search
CPC .............................. C25D 1/08; C23C 14/0005
USPC .......................................................... 205/75
See application file for complete search history.

(56) References Cited

U.S. PATENT DOCUMENTS 5,917,157 A * 6/1999 Remsburg ..................... 174/252
6,359,735 B1 3/2002 Gombert et al.
(Continued)

FOREIGN PATENT DOCUMENTS

| JP | 03-028397 | 2/1991 |
| JP | 03-061905 | 3/1991 |

(Continued)

OTHER PUBLICATIONS

Yuan, J.H., et al., "A simple method for preparation of through-hole porous anodic alumina membrane", Chem. Mater., 2004, 16, 1841-1844.*

(Continued)

*Primary Examiner* — Keith Hendricks
*Assistant Examiner* — Stefanie S Wittenberg
(74) *Attorney, Agent, or Firm* — Harness, Dickey & Pierce, P.L.C.

(57) ABSTRACT

A method for manufacturing an anodized film according to an embodiment of the present invention includes the steps of: (a) providing a multilayer structure that includes a base, a sacrificial layer which is provided on the base and which contains aluminum, and an aluminum layer which is provided on a surface of the sacrificial layer; (b) partially anodizing the aluminum layer to form a porous alumina layer which has a plurality of minute recessed portions; and (c) after step (b), separating the porous alumina layer from the multilayer structure. According to an embodiment of the present invention, a self-supporting anodized film which includes a porous alumina layer can be manufactured more conveniently as compared with the conventional methods.

9 Claims, 7 Drawing Sheets

(51) Int. Cl.
*C23C 14/00* (2006.01)
*C23C 14/18* (2006.01)
*C23C 14/58* (2006.01)
*C25D 11/12* (2006.01)
*C25D 11/24* (2006.01)
*C25D 11/10* (2006.01)

(52) U.S. Cl.
CPC ............ *C23C 14/5853* (2013.01); *C25D 11/04* (2013.01); *C25D 11/12* (2013.01); *C25D 11/24* (2013.01); *C25D 11/10* (2013.01)

(56) References Cited

U.S. PATENT DOCUMENTS

| | | | |
|---|---|---|---|
| 2003/0205475 A1 | 11/2003 | Sawitowski | |
| 2004/0004779 A1* | 1/2004 | Kochergin et al. | 359/885 |
| 2006/0194433 A1 | 8/2006 | Saito et al. | |
| 2007/0159698 A1* | 7/2007 | Taguchi et al. | 359/586 |
| 2008/0280426 A1* | 11/2008 | Li et al. | 438/492 |
| 2009/0090930 A1* | 4/2009 | Chen et al. | 257/103 |
| 2010/0086733 A1 | 4/2010 | Nakata | |

FOREIGN PATENT DOCUMENTS

| | | |
|---|---|---|
| JP | 2001517319 A | 10/2001 |
| JP | 2003531962 A | 10/2003 |
| JP | 2005156695 A | 6/2005 |
| JP | 2005307333 A | 11/2005 |
| JP | 2008045170 A | 2/2008 |
| JP | 2009120892 A | 6/2009 |
| JP | 2009299188 A | 12/2009 |
| JP | 2010064924 A | 3/2010 |
| JP | 2010090430 A | 4/2010 |
| WO | WO-2006059686 A1 | 6/2006 |
| WO | WO-2010116728 A1 | 10/2010 |
| WO | WO-2010125795 A1 | 11/2010 |
| WO | WO-2011135976 A1 | 11/2011 |

OTHER PUBLICATIONS

Foong, T.R.B., et al., "Origin of the bottlenecks in preparing anodized aluminum oxide (AAO) templates on ITO glass", ACS Nano, vol. 2, No. 11, 2008, 2250-2256.*

Chen, L-C., et al., "A nanoporous AIN layer patterned by anodic aluminum oxide and its application as a buffer layer in a GaN-based light-emitting diode", Nanotechnology, 20, 2009.*

International Preliminary Report on Patentability dated May 10, 2013.

International Search Report PCT/ISA/210 for International Application No. PCT/JP2011/073109 dated Dec. 27, 2011.

* cited by examiner (a)

(b)

(c)

(d)

(a)

(b)

(a)

×50,000

(b)

×20,000

(a)

× 50,000

(b)

× 50,000

(a)

× 50,000

(b)

× 50,000

(a)

(b)

(c)

METHOD FOR PRODUCING ANODIZED FILM

TECHNICAL FIELD

The present invention relates to a method for manufacturing an anodized film, and particularly to a method for manufacturing a self-supporting anodized film which includes a porous alumina layer. The self-supporting film refers to an element which is capable of maintaining itself as a film without being supported by a base.

BACKGROUND ART

An antireflection technique which has been receiving attention in recent years is forming over a substrate surface a very small uneven pattern in which the interval of recessed portions or raised portions is not more than the wavelength of visible light ($\lambda$=380 nm to 780 nm). See Patent Documents 1 to 4. The two-dimensional size of a raised portion of an uneven pattern which performs an antireflection function is not less than 10 nm and less than 500 nm.

This method utilizes the principles of a so-called moth-eye structure. The refractive index for light that is incident on the substrate is continuously changed along the depth direction of the recessed portions or raised portions, from the refractive index of a medium on which the light is incident to the refractive index of the substrate, whereby reflection of a wavelength band that is subject to antireflection is prevented.

The moth-eye structure is advantageous in that it is capable of performing an antireflection function with small incident angle dependence over a wide wavelength band, as well as that it is applicable to a number of materials, and that an uneven pattern can be directly formed in a substrate. As such, a high-performance antireflection film (or antireflection surface) can be provided at a low cost.

As the method of forming a moth-eye structure, using an anodized porous alumina layer which is obtained by means of anodization of aluminum has been receiving attention (Patent Documents 2 to 4).

Now, the anodized porous alumina layer which is obtained by means of anodization of aluminum is briefly described. Conventionally, a method of forming a porous structure by means of anodization has been receiving attention as a simple method for making nanometer-scale micropores (very small recessed portions) in the shape of a circular column in a regular arrangement. An aluminum base is immersed in an acidic electrolytic solution of sulfuric acid, oxalic acid, phosphoric acid, or the like, or an alkaline electrolytic solution, and this is used as an anode in application of a voltage, which causes oxidation and dissolution. The oxidation and the dissolution concurrently advance over a surface of the aluminum base to form an oxide film which has micropores over its surface. The micropores, which are in the shape of a circular column, are oriented vertical to the oxide film and exhibit a self-organized regularity under certain conditions (voltage, electrolyte type, temperature, etc.). Thus, this anodized porous alumina layer is expected to be applied to a wide variety of functional materials.

A porous alumina layer formed under specific conditions includes cells in the shape of a generally regular hexagon which are in a closest packed two-dimensional arrangement when seen in a direction perpendicular to the film surface. Each of the cells has a micropore at its center. The arrangement of the micropores is periodic. The cells are formed as a result of local dissolution and growth of a coating. The dissolution and growth of the coating concurrently advance at the bottom of the micropores which is referred to as a barrier layer. As known, the size of the cells, i.e., the interval between adjacent micropores (the distance between the centers), is approximately twice the thickness of the barrier layer, and is approximately proportional to the voltage that is applied during the anodization. It is also known that the diameter of the micropores depends on the type, concentration, temperature, etc., of the electrolytic solution but is, usually, about ⅓ of the size of the cells (the length of the longest diagonal of the cell when seen in a direction vertical to the film surface). Such micropores of the porous alumina may constitute an arrangement which has a high regularity (periodicity) under specific conditions, an arrangement with a regularity degraded to some extent depending on the conditions, or an irregular (non-periodic) arrangement.

Patent Document 2 discloses a method of producing an antireflection film (antireflection surface) with the use of a stamper which has an anodized porous alumina film over its surface.

Patent Document 3 discloses the technique of forming tapered recesses with continuously changing pore diameters by repeating anodization of aluminum and a pore diameter increasing process.

The applicant of the present application discloses, in Patent Document 4, the technique of forming an antireflection film with the use of an alumina layer in which very small recessed portions have stepped lateral surfaces.

Utilizing an anodized porous aluminum film in this way can facilitate the manufacture of a mold which is used for formation of a moth-eye structure over a surface (hereinafter, "moth-eye mold"). In particular, as described in Patent Documents 2 and 4, when the surface of the anodized aluminum film as formed is used as a mold without any modification, a large effect of reducing the manufacturing cost is achieved. The structure of the surface of a moth-eye mold which is capable of forming a moth-eye structure is herein referred to as "inverted moth-eye structure".

On the other hand, as described in Patent Documents 5 to 8, a method for manufacturing an anodized porous alumina film (self-supporting film) which has through holes has been researched.

Patent Document 5 discloses a method which includes anodizing an aluminum layer that is in tight contact with an aluminum base to form a porous alumina layer which has a barrier layer on the base side and a porous layer only on the aluminum layer side, and separating only the porous layer portion as a self-supporting film.

Patent Documents 6 to 8 disclose a method for obtaining a porous alumina layer by dissolving away an aluminum base remaining on the underlayer of a porous alumina layer after anodization.

The entire disclosures of Patent Documents 1, 2, and 4 to 8 are incorporated herein by reference.

CITATION LIST

Patent Literature

Patent Document 1: Japanese PCT National Phase Laid-Open Publication No. 2001-517319
Patent Document 2: Japanese PCT National Phase Laid-Open Publication No. 2003-531962
Patent Document 3: Japanese Laid-Open Patent Publication No. 2005-156695
Patent Document 4: WO 2006/059686
Patent Document 5: Japanese Laid-Open Patent Publication No. 2008-45170

Patent Document 6: Japanese Laid-Open Patent Publication No. 2009-120892

Patent Document 7: Japanese Laid-Open Patent Publication No. 2009-299188

Patent Document 8: Japanese Laid-Open Patent Publication No. 2010-64924

SUMMARY OF INVENTION

Technical Problem

However, in the method described in Patent Document 5, it is difficult to bring the aluminum layer (aluminum foil) into sufficiently tight contact with the aluminum base, and accordingly, it is difficult to prevent anodization of the rear surface side of the aluminum foil.

In the methods described in Patent Documents 6 to 8, it is difficult to dissolve away the remaining aluminum base from the entire surface using a treatment solution which permeates from the interface. Formation of a porous alumina film which has a particularly large area is difficult.

The present invention was conceived for the purpose of solving the above problems. One of the major objects of the present invention is to provide a method for manufacturing a self-supporting anodized film which includes a porous alumina layer obtained by anodizing an aluminum layer formed on a base, more conveniently than the conventional methods.

Solution to Problem

A method for manufacturing an anodized film according to the present invention includes the steps of: (a) providing a multilayer structure that includes a base, a sacrificial layer which is provided on the base and which contains aluminum, and an aluminum layer which is provided on a surface of the sacrificial layer; (b) partially anodizing the aluminum layer to form a porous alumina layer which has a plurality of minute recessed portions; and (d) after step (b), separating the porous alumina layer from the multilayer structure, wherein the anodized film is a self-supporting film which includes the porous alumina layer. The base may be an inorganic substrate (e.g., glass substrate) or may be a plastic substrate. Particularly when a glass substrate which contains an alkaline metal is used, considerable effects are achieved.

In one embodiment, the multilayer structure further includes an inorganic underlayer which is provided on a surface of the base, and the sacrificial layer is provided on the inorganic underlayer.

In one embodiment, the method further includes step (c) of, after step (b), bringing the porous alumina layer into contact with an etching solution.

According to a manufacturing method of one embodiment, step (c) includes (c1) bringing the porous alumina layer into contact with an etching solution to enlarge the plurality of minute recessed portions of the porous alumina layer, and (b1) after step (c1), further performing anodization to grow the plurality of minute recessed portions. Step (c1) and step (b1) may be alternately performed through a plurality of cycles.

In one embodiment, the porous alumina layer has a plurality of recessed portions whose two-dimensional size viewed in a direction normal to a surface is not less than 10 nm and less than 500 nm. The plurality of recessed portions may be regularly arranged or may be irregularly arranged.

In one embodiment, the porous alumina layer has a plurality of through holes whose two-dimensional size viewed in a direction normal to a surface is not less than 10 nm and less than 500 nm. The plurality of through holes may be regularly arranged or may be irregularly arranged.

In one embodiment, the inorganic underlayer is a silicon oxide layer or a titanium oxide layer.

In one embodiment, the sacrificial layer contains aluminum and either of oxygen or nitrogen, and the sacrificial layer has such a profile that a content of the aluminum is higher in a portion which is closer to the aluminum layer than in another portion which is closer to the base.

In one embodiment, the base is a glass base (glass substrate) which contains an alkaline metal, and the sacrificial layer is an $AlO_x$ layer. In this case, the oxygen atom concentration in the $AlO_x$ layer is preferably not less than 10 atomic % and not more than 30 atomic %, and the thickness of the $AlO_x$ layer is preferably not less than 40 nm and not more than 500 nm. In one embodiment, the thickness of the $AlO_x$ layer is more preferably not less than 50 nm and not more than 150 nm.

Advantageous Effects of Invention

According to the present invention, a method for manufacturing a self-supporting anodized film which includes a porous alumina layer obtained by anodizing an aluminum layer formed on a base, more conveniently than the conventional methods, is provided.

DESCRIPTION OF EMBODIMENTS

Hereinafter, a method for manufacturing a self-supporting anodized film which includes a porous alumina layer according to an embodiment of the present invention will be described with reference to the drawings. Note that the present invention is not limited to the embodiment which will be exemplified below.

Firstly, the adhesive property between a glass substrate and an aluminum layer (Al layer) is described.

The present inventor fabricated a moth-eye mold which is for formation of an antireflection film using an Al layer formed on a glass substrate and encountered a problem that the adhesive property between the Al layer (part of which is an anodized film) and the glass substrate deteriorates in the anodization step or the etching step. This problem was more serious when the substrate used was a substrate made of glass which contains an alkaline metal (soda lime glass). The present inventor also encountered a problem that, when a plastic film was used as the base, the adhesive property between the Al layer and the plastic film deteriorated. Note that, herein, the adhesive property between the base and the Al layer refers not only to the inseparability of the Al layer in the case where the Al layer is directly formed on a surface of the base but also to the inseparability of the Al layer in the case where another layer is interposed between the surface of the base and the Al layer.

Now, a method for manufacturing a moth-eye mold using an Al layer formed on a glass substrate is described with reference to FIGS. 9(a) to 9(e).

Figure 9:
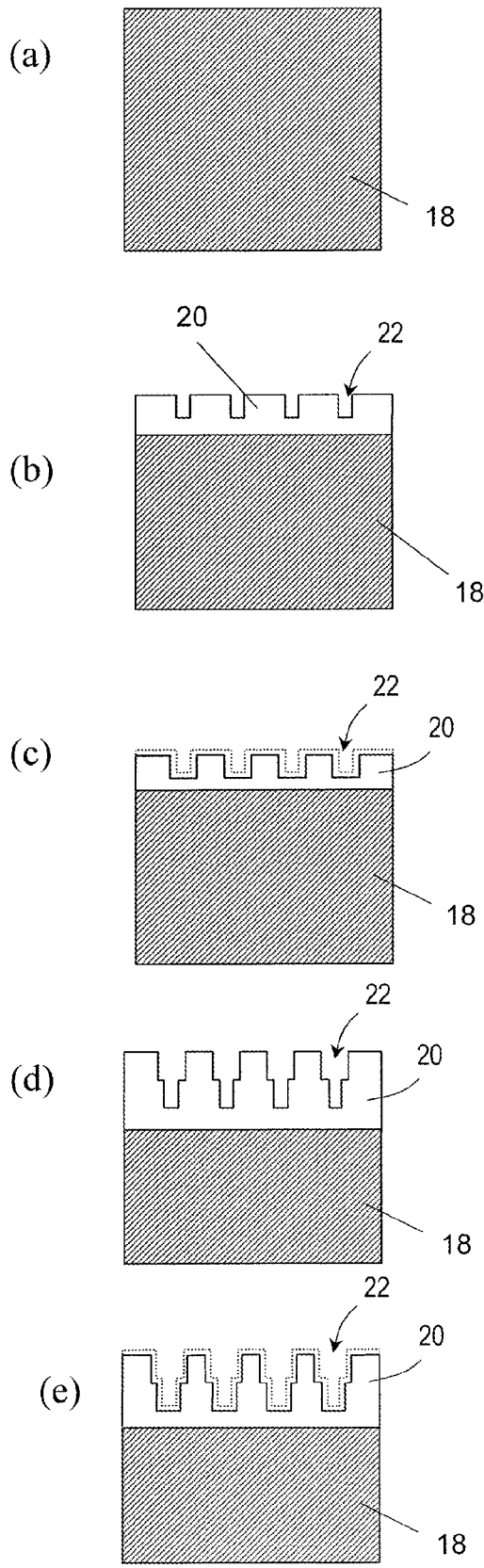
[FIG. 9] (a) to (e) are schematic cross-sectional views for illustrating a known porous alumina layer manufacturing method.

First, as shown in FIG. 9(a), a multilayer structure is provided which has an Al layer 18 over its surface. In FIGS. 9(a) to 9(e), for the sake of simplicity, only the Al layer 18 is shown. The Al layer 18 is formed by sputtering using, for example, an aluminum target with a purity of 99.99 mass % or higher. The thickness of the Al layer 18 is, for example, 1000 nm (1 μm). The thickness of the Al layer 18 is appropriately set according to the intended thickness of an anodized alumina layer. For example, the thickness of the Al layer 18 is not less than 100 nm and not more than 3000 nm.

Then, part of the Al layer 18 (surface portion) is anodized under predetermined conditions to form a porous alumina layer 20 which has micropores 22 as shown in FIG. 9(b). The size of the micropores 22, the formation density of the micropores 22, the depth of the micropores 22, etc., can be controlled according to the anodization conditions (e.g., the forming voltage, the type and concentration of the electrolytic solution, the duration of anodization, etc.). By controlling the level of the forming voltage, the regularity of the arrangement of the micropores 22 can be controlled. For example, a voltage at 80 V is applied for 40 seconds with the use of a 0.1 M oxalic aqueous solution at 20° C., whereby a porous alumina layer 20 can be obtained in which the distance between adjacent micropores is 190 nm and which has a thickness of about 100 nm.

Note that the first-formed porous alumina layer 20 may be removed when necessary. The first-formed porous alumina layer 20 may include many defects due to the effects of impurities and the like. The thickness of the first-formed porous alumina layer 20 that is to be removed is preferably not less than 200 nm in view of reproducibility. In view of productivity, it is preferably not more than 2000 nm. As a matter of course, when necessary, the first-formed porous alumina layer 20 may be partially removed (e.g., to a certain depth from the surface). The removal of the porous alumina layer 20 can be realized by a known method, e.g., immersion in a phosphoric acid aqueous solution or a chromium-phosphoric acid mixture solution for a predetermined time period.

Then, the porous alumina layer 20 which have the micropores 22 is brought into contact with an alumina etchant to etch away a predetermined amount, such that the pore diameter of the micropores 22 is increased as shown in FIG. 9(c). Employing wet etching in this step enables substantially isotropic etching of the pore wall and the barrier layer. The etching amount (i.e., the size and depth of the micropores 22) can be controlled by adjusting the type and concentration of the etching solution and the etching duration. The etching solution used herein may be an aqueous solution of an organic acid, such as phosphoric acid, formic acid, acetic acid, citric acid, or the like, of 10 mass %, or a chromium-phosphoric acid mixture solution.

Thereafter, the Al layer 18 is again partially anodized such that the micropores 22 are grown in the depth direction and the thickness of the porous alumina layer 20 is increased as shown in FIG. 9(d). Here, the growth of the micropores 22 starts at the bottom of the previously-formed micropores 22, so that the lateral surface of the micropores 22 has a stepped shape.

Thereafter, when necessary, the porous alumina layer 20 is brought into contact with an etchant of alumina to be further etched such that the diameter of the micropores 22 is further increased as shown in FIG. 9(e). The etching solution used in this step may preferably be the above-described etching solution. Practically, the same etching bath may be used.

In this way, by alternately repeating the anodization step (FIG. 9(b)) and the etching step (FIG. 9(c)) as described above (for example, four cycles of the anodization step and three cycles of the etching step), the porous alumina layer 20 provided with the micropores (very small recessed portions) 22, which has a desired uneven pattern, can be obtained. By appropriately determining the conditions for each of the anodization steps and the etching steps, the size, formation density, and depth of the micropores 22 as well as the stepped shape of the lateral surface of the micropores 22 can be controlled. To decrease the bottom portion of the micropores 22, the process is preferably ended with the anodization step (without performing any subsequent etching step). When viewed in a direction normal to the surface, the two-dimensional size of the micropores (recessed portions) 22 is, for example, not less than 10 nm and less than 500 nm, and the distance between adjacent micropores (recessed portions) 22 is not less than 30 nm and less than 600 nm.

In the example described herein, the anodization step and the etching step are alternately performed. However, between the anodization step and the etching step, or between the etching step and the anodization step, a washing step and a drying step subsequent thereto may be performed. Also, in an interval between the anodization steps, the anodization conditions such as the forming voltage can be changed.

As described above, in the above fabrication method, when the multilayer structure used was a glass substrate which had an Al layer at its surface, specifically a soda lime glass substrate which had an Al layer at its surface, the adhesive property between the Al layer (part of which was an anodized layer) and the glass substrate deteriorated in the anodization step or the etching step. This problem was more serious when a substrate made of glass containing an alkaline metal (soda lime glass) was used as the glass substrate. When a plastic film was used as the base, the adhesive property between the Al film and the plastic film deteriorated. Specifically, in some cases, a portion or entirety of the Al layer peeled off from the glass substrate or plastic film during the anodization step or the etching step.

Figure 1:
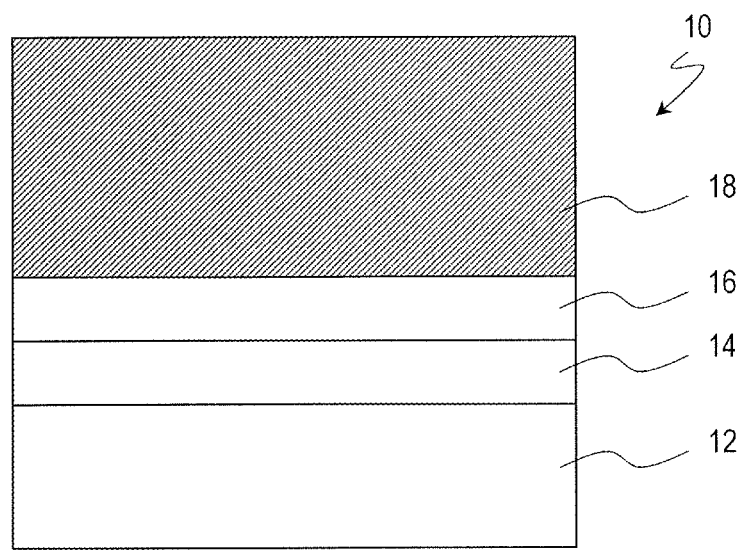
[FIG. 1] A schematic cross-sectional view of a multilayer structure 10 that is for use in an anodized film manufacturing method according to an embodiment of the present invention.
Figure 3:
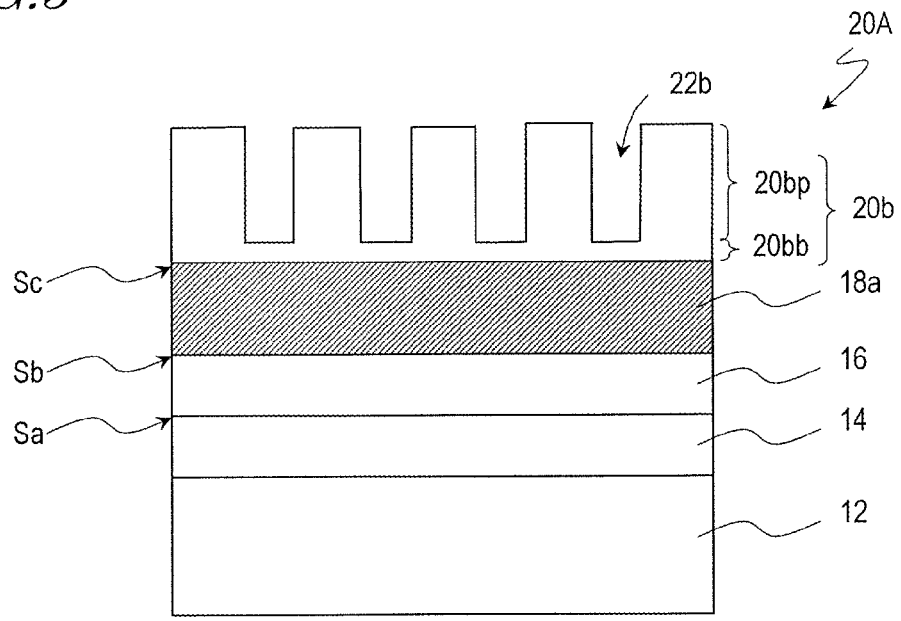
[FIG. 3] (a) to (d) are schematic cross-sectional views for illustrating an anodized film manufacturing method which is another embodiment of the present invention.
Figure 3:
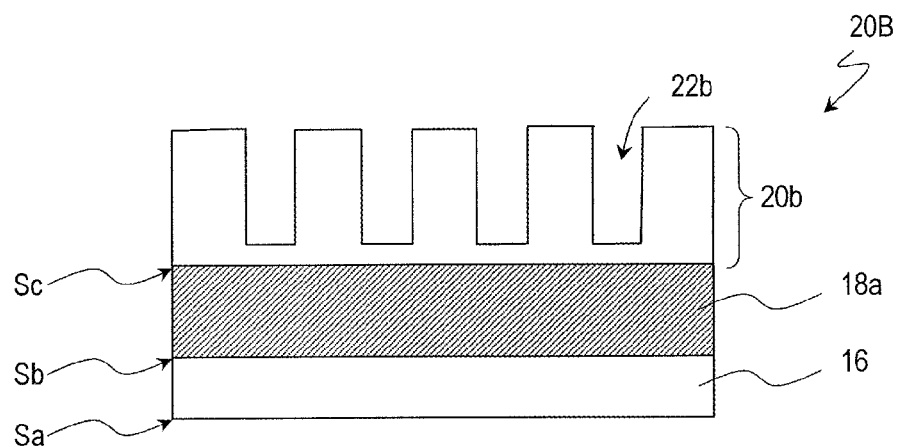
Figure 3:
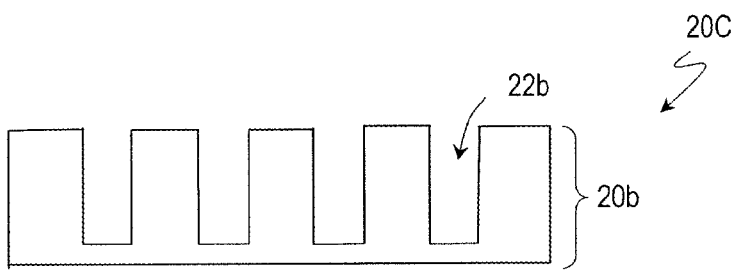
Figure 3:
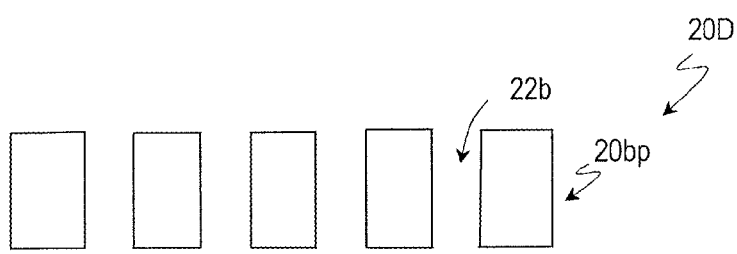
Figure 4:
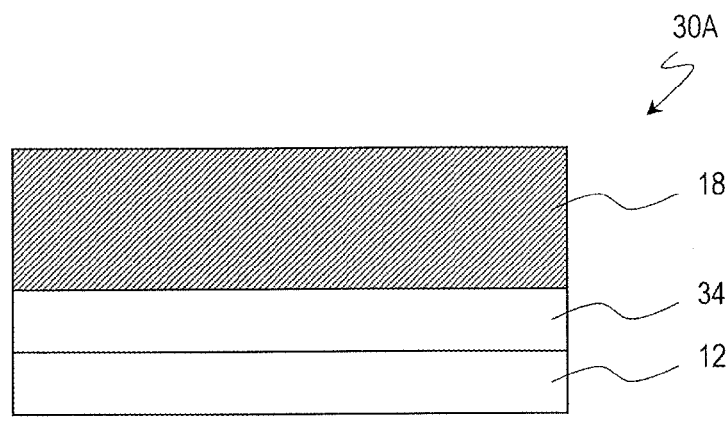
[FIGS. 4] (a) and (b) are schematic cross-sectional views of comparative example multilayer structures 30A and 30B, respectively.
Figure 4:
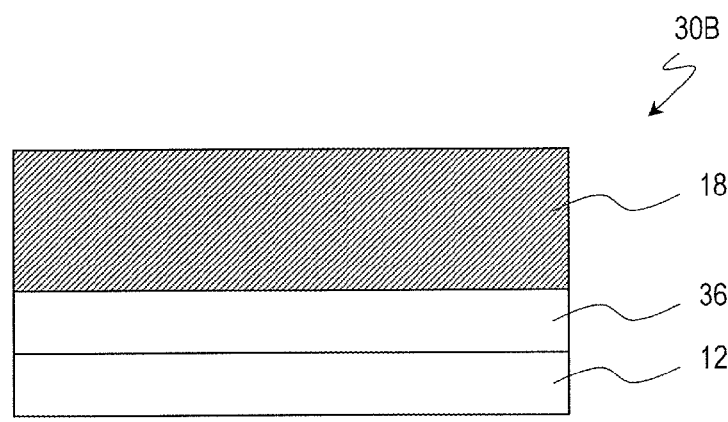

Hereinafter, an anodized film manufacturing method and a multilayer structure for use in that method according to an embodiment of the present invention are described with reference to FIG. 1 to FIG. 3. FIG. 1 shows a schematic cross-sectional view of a multilayer structure 10 that is for use in an anodized film manufacturing method according to an embodiment of the present invention. FIGS. 2(a) to 2(d) are schematic cross-sectional views for illustrating an anodized film manufacturing method which is an embodiment of the present invention. FIGS. 3(a) to 3(d) are schematic cross-sectional views for illustrating an anodized film manufacturing method which is another embodiment of the present invention. FIGS. 4(a) and 4(b) are schematic cross-sectional views of comparative example multilayer structures 30A and 30B, respectively.

As shown in FIG. 1, the multilayer structure 10 that is used in the anodized film manufacturing method according to an embodiment of the present invention includes a glass substrate 12, an inorganic underlayer 14 which is provided on a surface of the glass substrate 12, a sacrificial layer 16 which is provided on the inorganic underlayer 14 and which contains aluminum, and an Al layer 18 which is provided on a surface of the sacrificial layer 16. As a result, it is possible to solve the problem that the adhesive property between the base and the Al layer excessively decreases during the anodization step or the etching step. Note that, when an electrically-conductive layer (preferably, a valve metal layer) is provided as a backing in order to uniformly anodize the Al layer 18, the electrically-conductive layer is preferably provided between the inorganic underlayer 14 and the sacrificial layer 16 or between the sacrificial layer 16 and the Al layer 18.

The inorganic underlayer 14 is directly formed on a surface of the glass substrate 12. The inorganic underlayer 14 has the function of preventing an alkaline metal element contained in the glass substrate 12 from dissolving out of the glass substrate 12. From the viewpoint of the adhesive property with the glass substrate 12, the inorganic underlayer 14 is preferably made of an inorganic oxide or an inorganic nitride. When an inorganic oxide is used, for example, the inorganic underlayer 14 is preferably a silicon oxide layer or a titanium oxide layer. When an inorganic nitride is used, for example, the inorganic underlayer 14 is preferably a silicon nitride layer. It is also preferred that the thermal expansion coefficient of the inorganic underlayer 14 is adapted by adding an impurity to the inorganic oxide layer or inorganic nitride layer. For example, when a silicon oxide layer is used, the thermal expansion coefficient can be increased by adding germanium (Ge), phosphorus (P), or boron (B). When 5 mass % Ge is added to the silicon oxide, for example, the thermal expansion coefficient is about $2.8 \times 10^{-6}/°C$., which is about three times that obtained when Ge is not added. Note that, when the material of the glass substrate is a glass material from which the amount of alkali dissolved away is small, such as Pyrex (registered trademark) glass, the above-described inorganic underlayer may be omitted.

The thickness of the inorganic underlayer 14 is preferably not less than 40 nm and, more preferably, not less than 100 nm. When the thickness of the inorganic underlayer 14 is less than 40 nm, the effects of provision of the inorganic underlayer 14 are not sufficiently produced, so that dissolution of an alkaline metal element out of the glass substrate 12 cannot be sufficiently blocked in some cases. TABLE 1 shows the results of evaluation of the alkaline passivation property.

The evaluation method is now generally described. The samples shown in TABLE 1 (each of which is a square soda lime glass plate of 70 mm×70 mm) were washed by pure water ultrasonic cleaning for two minutes. Then, each of the samples was placed on a platinum dish of 65 mmΦ such that an analysis surface faces onto the platinum dish (i.e., the analysis surface is the lower surface), and was subjected to a heat treatment (heated for about two hours to reach 200° C., maintained at 200° C. for one hour, and thereafter cooled by means of spontaneous heat radiation (for about a half day)). Thereafter, the analysis surface of each sample was exposed to pure water, and Na dissolved into the pure water was quantitated using a flame method. As seen from TABLE 1, the amount of dissolved alkaline can be reduced by forming a 40 nm thick $SiO_2$ film. The alkaline blocking effect can be greatly increased by forming a 100 nm thick $SiO_2$ film.

TABLE 1

| Samples | Amount of alkali dissolved away (ng/cm$^2$) |
|---|---|
| Bare Glass Plate (Soda Lime Glass) | 12 |
| Glass Plate with 40 nm thick SiO$_2$ Layer | 8 |
| Glass Plate with 100 nm thick SiO$_2$ Layer | 2 |

The thickness of the inorganic underlayer 14 is preferably not more than 500 nm and, more preferably, not more than 200 nm. If the thickness of the inorganic underlayer 14 is more than 500 nm, the time required for formation of the inorganic underlayer 14 will be unduly long. Also, the adhesive power between the glass substrate 12 and the inorganic underlayer 14 can deteriorate due to thermal stress (shear stress) which is attributed to the difference in thermal expansion coefficient between the glass substrate 12 and the inorganic underlayer 14. In the case where a flexible base such as a plastic film is used, if the thickness of the inorganic underlayer 14 is more than 500 nm, a crack may be formed in the inorganic underlayer 14 when the base is bent.

The sacrificial layer 16 is provided between the inorganic underlayer 14 and the Al layer 18. The sacrificial layer 16 has the function of improving the adhesive property between the inorganic underlayer 14 and the Al layer 18. The sacrificial layer 16 is made of a material which has excellent acid resistance and protects the inorganic underlayer 14 from acid.

The sacrificial layer 16 preferably contains aluminum and either of oxygen or nitrogen. The sacrificial layer 16 preferably has such a profile that the aluminum content is higher in a portion which is closer to the Al layer 18 than in another portion which is closer to the inorganic underlayer 14 (i.e., closer to the base), although the oxygen or nitrogen content may be uniform. This is because the property values, such as the thermal expansion coefficient, exhibit excellent conformity. The thickness of the sacrificial layer 16 is preferably not less than 40 nm. The thickness of the sacrificial layer 16 is preferably not more than 500 nm and, more preferably, not more than 200 nm. If the thickness of the sacrificial layer 16 is less than 40 nm, it is difficult to sufficiently protect the inorganic underlayer 14 from a treatment solution permeating from the Al layer 18 side (the electrolytic solution in the anodization step and/or the etching solution in the etching step), i.e., the effects of provision of the sacrificial layer 16 are not sufficiently produced. If the thickness of the sacrificial layer 16 is more than 500 nm, the time required for formation of the sacrificial layer 16 will be unduly long. Thus, this case is not preferred.

The profile of the aluminum content in the sacrificial layer 16 along the thickness direction may vary stepwise or may continuously vary. For example, when the sacrificial layer 16 is formed of aluminum and oxygen, a plurality of Al oxide layers which have gradually decreasing oxygen contents are formed, and then, the Al layer 18 is formed on the uppermost aluminum oxide layer. This process also applies to a case where the sacrificial layer 16 is formed of aluminum and nitrogen.

The Al layer 18 may be formed using a known method (e.g., electron beam deposition or sputtering). Here, the Al layer 18 having a thickness of about 1 µm is preferably formed through a plurality of separate cycles rather than formed at once in one cycle. Specifically, it is preferred to repeat the cycle of depositing aluminum to a certain thickness before an intermission of a certain time period and resuming the deposition after the intermission till the Al layer 18 having a predetermined thickness (e.g., 1 µm) is obtained, rather than to continuously deposit aluminum to the predetermined thickness. For example, it is preferred that the Al layer 18 having a thickness of about 1 µm is obtained by forming 20 aluminum layers each of which has a thickness of 50 nm in such a manner that every formation of the 50 nm thick aluminum layer is followed by an intermission. In this way, the deposition of aluminum is carried out in a plurality of separate cycles, whereby the quality of the finally-obtained Al layer 18 (e.g., the chemical resistance or the adhesive property) can be improved. This is probably because continuous deposition of aluminum increases the temperature of a base (a base having a surface on which the Al layer is to be deposited), and as a result, the distribution of thermal stress in the Al layer 18 becomes nonuniform so that the film quality deteriorates.

Next, an anodized film manufacturing method according to an embodiment of the present invention is described with reference to FIGS. 2(a) to 2(d).

First, a porous alumina layer 20a is formed using the multilayer structure 10 shown in FIG. 1 according to the method which has previously been described with reference to FIGS. 9(a) to 9(e), whereby a multilayer structure 10A is obtained as shown in FIG. 2(a). The multilayer structure 10A includes a glass substrate 12, an inorganic underlayer 14 which is provided on a surface of the glass substrate 12, a sacrificial layer 16 which is provided on the inorganic underlayer 14 and which contains aluminum, an Al layer 18a which is provided on a surface of the sacrificial layer 16, and a porous alumina layer 20a which is provided on a surface of the Al layer 18a. The porous alumina layer 20a includes a porous layer 20ap which has recessed portions 22a and a barrier layer 20ab.

Since the multilayer structure 10 includes the sacrificial layer 16, the adhesive property between the glass substrate 12 and the Al layer 18 would not excessively decrease during the anodization step or the etching step as will be described later with experiment examples. Therefore, the anodization step and the etching step can be repeated through a necessary number of cycles. For example, by alternately repeating the anodization step and the etching step through a large number of cycles, the stepped lateral surfaces of the recessed portions 22a such as shown in FIG. 2(a), for example, can be made to be substantially smooth curve surfaces. By varying the duration of the anodization step or the duration of the etching step, the recessed portions 22a can be formed to have various cross-sectional shapes. In other words, the adhesive property between the glass substrate 12 and the Al layer 18 may be adjusted in consideration of the balance between the anodization step and the etching step that are necessary for formation of the porous alumina layer 20a and a separation step which will be described later. The adhesive property between the glass substrate 12 and the Al layer 18 can be controlled by regulating, for example, the composition (i.e., the concentration and distribution of oxygen and nitrogen atoms) and the thickness of the sacrificial layer 16.

Then, as shown in FIG. 2(b), the porous alumina layer 20a is separated (peeled off) from the multilayer structure 10A. This separation is realized by peeling off (interfacial fracture) at the interface Sa between the inorganic underlayer 14 and the sacrificial layer 16. The interface Sb between the sacrificial layer 16 and the Al layer 18a has a high adhesive property because the aluminum concentration in the sacrificial layer 16 is higher in a portion which is closer to the Al layer 18a and, for example, continuously varies. Therefore, a fracture is unlikely to occur at the interface Sb. The interface Sc between the porous alumina layer 20a, which is formed by anodization of part of the Al layer 18, and the remaining part (unanodized part) 18a of the Al layer 18 also has a high adhesive property. Therefore, peeling off (interfacial fracture) is unlikely to occur at the interface Sc. Note that, although peeling off is likely to occur at the interface Sa, a cohesive fracture can sometimes occur in the inorganic underlayer 14, the sacrificial layer 16, and the Al layer 18a, and an interfacial fracture at the interface Sb or Sc can sometimes partially occur.

Examples of the separation method includes: pressing silicone rubber which has tackiness (stickiness) against the entire surface of the porous alumina layer 20a and then peeling off the silicone rubber; sucking an end of the porous alumina layer 20a using a vacuum tweezers, or the like, and gradually peeling off the layer in such a manner that the peeling is started from the sucked end; and pressing a vacuum adsorption film (for example, FIXFILm (registered trademark) manufactured by FUJICOPIAN CO., LTD.) against the entire surface of the porous alumina layer 20a and then peeling off the vacuum adsorption film.

Then, the sacrificial layer 16 and the Al layer 18a of the multilayer structure 10B are removed as shown in FIG. 2(c). This process can be realized by using an appropriate treatment solution. For example, when the sacrificial layer 16 is an AlOx layer, a wet etching method with the use of hot phosphoric acid or hydrofluoric acid is preferably employed. The removal of the Al layer 18a may be realized by using methods described in Patent Documents 6 to 8 (for example, a method which employs methanol bromide, iodomethanol, or mercurous chloride solution). Here, according to the methods described in Patent Documents 6 to 8, the aluminum base and the porous alumina layer are separated using a treatment solution entering from the interface, whereas according to the embodiment of the present invention, as understood from FIG. 2(b), the sacrificial layer 16 and the Al layer 18a are subjected to a treatment solution with their rear surfaces being entirely exposed. Therefore, the sacrificial layer 16 and the Al layer 18a are each removed surely and entirely within a short period of time.

In this way, a self-supporting anodized film 10C which is formed by only the porous alumina layer 20a is obtained.

Then, when necessary, the barrier layer 20ab of the porous alumina layer 20a is removed, whereby a self-supporting anodized film 10D which has through holes 22a is obtained as shown in FIG. 2(d). For example, the barrier layer 20ab may be chemically removed using a mixture solution of chromic acid and phosphoric acid, an acid aqueous solution, such as a phosphoric acid solution or a sulfuric acid solution, or an alkaline aqueous solution, such as a sodium hydroxide solution, as described in Patent Documents 6 to 8. Alternatively, the barrier layer 20ab may be physically removed by irradiation with an ion beam or an electron beam or may be mechanically removed by polishing.

Next, an anodized film manufacturing method according to another embodiment of the present invention is described with reference to FIGS. 3(a) to 3(d).

First, the multilayer structure 10 shown in FIG. 1 is used, and part of the surface of the Al layer 18 is anodized to form a porous alumina layer 20b, whereby a multilayer structure 20A is obtained as shown in FIG. 3(a). The porous alumina layer 20b includes a porous layer 20bp which has recessed portions 22b in the shape of a circular cylinder and a barrier layer 20bb. Since the multilayer structure 10 includes the sacrificial layer 16, the adhesive property between the glass substrate 12 and the Al layer 18 would not excessively decrease during the anodization step.

Thereafter, as shown in FIG. 3(b), the porous alumina layer 20b is separated (peeled off) from the multilayer structure 20A. This process may be carried out in the same way as previously described with reference to FIG. 2(b).

Then, as shown in FIG. 3(c), the sacrificial layer 16 and the Al layer 18a of the multilayer structure 20B are removed. This process may be carried out in the same way as previously described with reference to FIG. 2(c). In this way, a self-supporting anodized film 20C which is formed by only the porous alumina layer 20b is obtained.

Then, when necessary, the barrier layer 20bb of the porous alumina layer 20b is removed, whereby a self-supporting anodized film 20D which has through holes 22b is obtained as shown in FIG. 3(d). This process may be carried out in the same way as previously described with reference to FIG. 2(d).

As described above, according to an anodized film manufacturing method of an embodiment of the present invention, the self-supporting anodized film 10C or 20C that is formed by only the porous alumina layer 20a or 20b that has the recessed portions 22a or 22b is obtained. By appropriate combination of the anodization step and the etching step, recessed portions which have stepped lateral surfaces or smooth curve lateral surfaces or recessed portions which are in the shape of a circular cylinder can be formed. Further, by removing the barrier layer 20ab, 20bb, the self-supporting anodized film 10D or 20D that has the through holes 22a or 22b can be obtained. Further, as well known in the art, by appropriately determining the conditions for the anodization, the recessed portions or through holes may be regularly arranged or may be irregularly arranged.

In an anodized film manufacturing method according to an embodiment of the present invention, the process of separating the porous alumina layer 20a, 20b from the multilayer structure 10A, 20A is mainly realized by the interfacial fracture (peeling off) at the interface Sa between the sacrificial layer 16 and the inorganic underlayer 14 and the cohesive fracture in the sacrificial layer 16. During the anodization step and/or the etching step, the sacrificial layer 16 functions to enhance stable adhesion of the Al layer 18 to the base 12. After formation of the porous alumina layer 20a, 20b, the sacrificial layer 16 has such an adhesive power that the porous alumina layer 20a, 20b can readily be separated from the multilayer structure 10A, 20A. In other words, the adhesive property of the sacrificial layer 16 may be adjusted according to the conditions and the number of cycles of the anodization step and/or the etching step which are required for formation of the porous alumina layer 20a, 20b.

Hereinafter, improvement of the adhesive property between the base and the Al layer which is achieved by the use of the multilayer structure 10 is specifically described with experiment examples and comparative examples.

EXPERIMENT EXAMPLE 1 AND
COMPARATIVE EXAMPLES 1 AND 2

A multilayer structure 10 of Experiment Example 1 which had the configuration shown in FIG. 1 was fabricated as described below.

As the glass substrate 12, a substrate of soda lime glass (or "blue glass plate") having a thickness of 2.8 mm was provided.

A $SiO_2$ layer 14 having a thickness of about 100 nm, a sacrificial layer 16 (containing aluminum and oxygen) having a thickness of about 100 nm, an Al layer 18 having a thickness of 1 μm were formed directly over the surface of the glass substrate 12. These layers were all formed in the same vacuum chamber by sputtering. The sputtering conditions were as follows. The vacuum degree of the background: $1 \times 10^{-5}$ Torr (0.0013 Pa), the atmosphere gas: Ar, the vacuum degree during sputtering: $1 \times 10^{-3}$ Torr (0.13 Pa), the Al target purity: 99.999 mass %.

Here, as the sacrificial layer 16, a sacrificial layer including a plurality of Al oxide layers of different oxygen contents was formed. The plurality of aluminum oxide layers were formed to have such a profile that an aluminum oxide layer which was closer to the $SiO_2$ layer 14 had a higher oxygen content, in other words, such a profile that the aluminum content was higher in a portion which was closer to the Al layer 18 than in another portion which was closer to the $SiO_2$ layer 14. Note that the sacrificial layer 16 may be formed by a single aluminum oxide layer.

When the sacrificial layer 16 was formed by two aluminum oxide layers, the oxygen content of one of the aluminum oxide layers which was closer to the $SiO_2$ layer 14 was not less than 30 at % and not more than 60 at %, the oxygen content of the other aluminum oxide layer which was closer to the Al layer 18 was not less than 5 at % and not more than 30 at %, and the oxygen contents of the two aluminum oxide layers simultaneously met these conditions.

When the sacrificial layer 16 was formed by three aluminum oxide layers, the oxygen content of one of the aluminum oxide layers which was closer to the $SiO_2$ layer 14 was not less than 35 at % and not more than 60 at %, the oxygen content of the middle aluminum oxide layer was not less than 20 at % and not more than 35 at %, the oxygen content of the other aluminum oxide layer which was closer to the Al layer 18 was not less than 5 at % and not more than 20 at %, and the oxygen contents of the three aluminum oxide layers simultaneously met these conditions. As a matter of course, the sacrificial layer 16 may be formed by four or more aluminum oxide layers.

The sacrificial layer 16 may be formed by, for example, using any of the three methods (1) to (3) described below.

(1) The film is formed by reactive sputtering with the use of a mixture gas of Ar gas and $O_2$ gas and an Al target which contains the oxygen element. Here, the oxygen content in the target is preferably not less than 1 at % and not more than 40 at %. If the oxygen content in the target is less than 1 at %, the effects of oxygen contained in the target are insufficient. If the oxygen content in the target is more than 40 at %, the $O_2$ gas is unnecessary.

(2) The film is formed by reactive sputtering with the use of a pure Ar gas as the sputtering gas and an Al target which contains the oxygen element. Here, the oxygen content in the target is preferably not less than 5 at % and not more than 60 at %. If the oxygen content in the target is less than 5 at %, the amount of oxygen contained in the formed aluminum oxide layer may be insufficient. If the oxygen content in the target is more than 60 at %, the content of the oxygen element in the formed aluminum oxide layer may be excessively high. If the content of the oxygen element in the aluminum oxide layer which is closer to the inorganic underlayer (i.e., closer to the base) is more than 60 at %, the adhesive property between the inorganic underlayer ($SiO_2$) and the aluminum oxide layer can deteriorate.

(3) The film is formed by reactive sputtering with the use of a pure aluminum target. Here, the flow rate ratio of the Ar gas and the $O_2$ gas of the mixture gas used in the sputtering is, approximately, more than 2:0 and not more than 2:1. If the flow rate ratio of the Ar gas and the $O_2$ gas is more than 2:1, the content of the oxygen element in the formed aluminum oxide layer may be excessively high.

As Experiment Example 1, the sacrificial layer 16 including two aluminum oxide layers was formed using the above method (3). The oxygen contents of the aluminum oxide layers were 5 at % and 48 at %, which met the above conditions. The oxygen content was measured by X-ray photoelectron spectroscopy (ESCA).

The thermal expansion coefficients of the respective constituents of the multilayer structure 10 (in the range from room temperature to 100° C.) are as follows:
Substrate 12: soda lime glass: $8.7 \times 10^{-6}$/° C.
Inorganic underlayer 14: $SiO_2$: $1.0 \times 10^{-6}$/° C.
Sacrificial layer 16: $Al_2O_3$: $6.9 \times 10^{-6}$/° C.
Al layer 18: Al: $23 \times 10^{-6}$/° C.

Here, in Experiment Example 1, the oxygen content of the sacrificial layer 16 is lower than that of $Al_2O_3$ (although accurate measurement is difficult). Therefore, the thermal expansion coefficient of the sacrificial layer 16 is larger than that of $Al_2O_3$ ($6.9 \times 10^{-6}$/° C.) and is smaller than that of Al ($23 \times 10^{-6}$/° C.). Thus, by providing the sacrificial layer 16, the adhesive property with the Al layer 18 is improved.

The thermal expansion coefficient of the inorganic underlayer 14 that is made of $SiO_2$ is smaller than those of the substrate 12 and the sacrificial layer 16 (lowermost layer). Therefore, it is preferred to dope $SiO_2$ with Ge at about 5 mass % to 10 mass % such that the thermal expansion coefficients conform to each other.

The multilayer structure 30A of Comparative Example 1 shown in FIG. 4(a) was formed according to the multilayer structure fabrication method used in the above experiment example except that the sacrificial layer 16 was not formed, and instead, an inorganic underlayer 34 was formed of $SiO_2$ on the glass substrate 12 before the formation of the Al layer 18.

The multilayer structure 30B of Comparative Example 2 shown in FIG. 4(b) was formed according to the multilayer structure fabrication method used in the above experiment example except that the inorganic underlayer 14 was not formed, and instead, a sacrificial layer 36 which was the same as the above sacrificial layer was formed on the glass substrate 12 before the formation of the Al layer 18.

The obtained multilayer structures were evaluated in terms of the adhesive property between the glass substrate 12 and the Al layer 18 by a so-called peeling test (crosscut test) as will be described below.

In each of the multilayer structures, the layers formed on the glass substrate 12 were cut into a matrix of 5×5 squares, each having a size of 1 cm×1 cm, using a utility knife, with the incision reaching the surface of the glass substrate 12. An adhesive tape (Scotch tape BH-24 manufactured by Sumitomo 3M Limited) was tightly placed onto the Al layer 18 so as to cover a region of the cut squares and then peeled off from the Al layer 18. The number of squares (including the Al layer 18, the inorganic underlayer 14, 34 and/or the sacrificial layer 16, 36) which were removed together with the peeled adhesive tape was counted for evaluation. The results of the evaluation are shown in TABLE 2. ⊚ means that no square was removed. ○ means that the number of removed squares was not less than 1 and less than 5. Δ means that the number of removed squares was not less than 5 and less than 10. X means that the number of removed squares was not less than 10.

The peeling test was carried out on the following samples in different phases:
"INITIAL": Samples immediately after fabrication of the above multilayer structures;
"ANODIZATION+ETCHING": Samples with the inverted moth-eye structure which was formed through the fabrication steps that have been previously described with reference to FIGS. 9(a) to 9(e). (The anodization conditions were treatment solution: oxalic acid (0.05 mol/L (liter)), treatment temperature: 5° C., voltage: 80 V, and treatment duration: 1 min. The etching conditions were treatment solution: phosphoric acid (8 mol/L), treatment temperature: 30° C., and treatment duration: 20 min.).

TABLE 2

|  | Inventive Example 1 | Comparative Example 1 | Comparative Example 2 |
|---|---|---|---|
| INITIAL | ⊚ | Δ | ○ |
| ANODIZATION + ETCHING | ○ | Δ | X |

As clearly seen from the results of TABLE 2, in both Comparative Examples 1 and 2, the adhesive property after the anodization and the etching was not sufficient. When the multilayer structure of Experiment Example 1 was used, the adhesive property between the glass substrate 12 and the Al layer 18 was improved so that the adhesive property was sufficient even after the anodization and the etching.

In Comparative Example 1, it is inferred that, in the multilayer structure 30A that only included the inorganic underlayer 34 made of $SiO_2$, $SiO_2$ was chemically damaged by the treatment solution entering from the Al layer 18 side in the anodization step and/or the etching step.

In Comparative Example 2, it is inferred that, in the multilayer structure 30B that only included the sacrificial layer 36, the treatment solution entered a gap between the glass substrate 12 and the sacrificial layer 36 in the anodization step and/or the etching step, and the alkaline metal element contained in the glass was dissolved out due to a reaction with the treatment solution and caused corrosion of the anodized alumina layer.

EXPERIMENT EXAMPLE 2, COMPARATIVE EXAMPLES 3 AND 4

In Experiment Example 2, a plastic film 12 was used whereas the glass substrate 12 was used in the above-described multilayer structure of Experiment Example 1.

Figure 2:
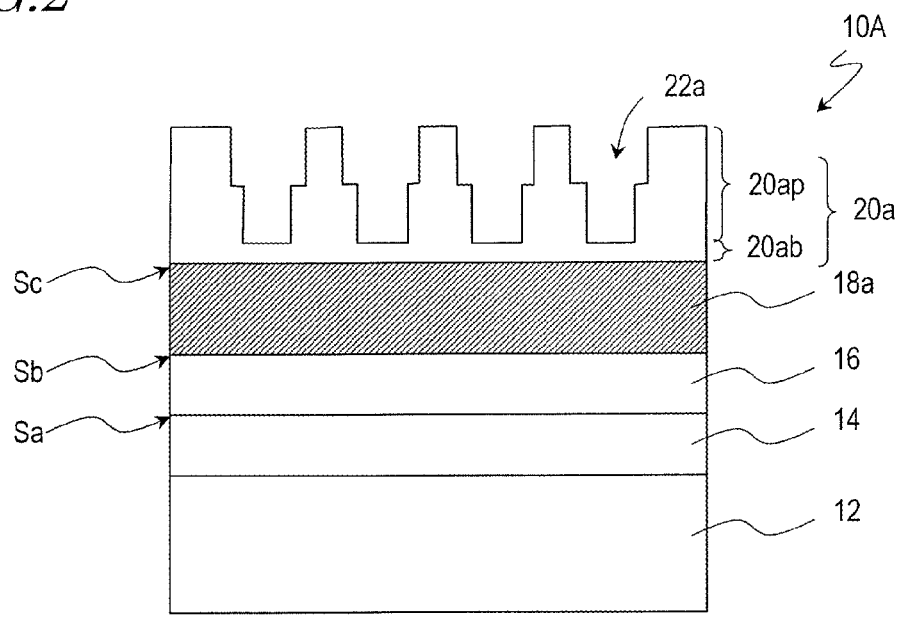
[FIG. 2] (a) to (d) are schematic cross-sectional views for illustrating an anodized film manufacturing method which is an embodiment of the present invention.
Figure 2:
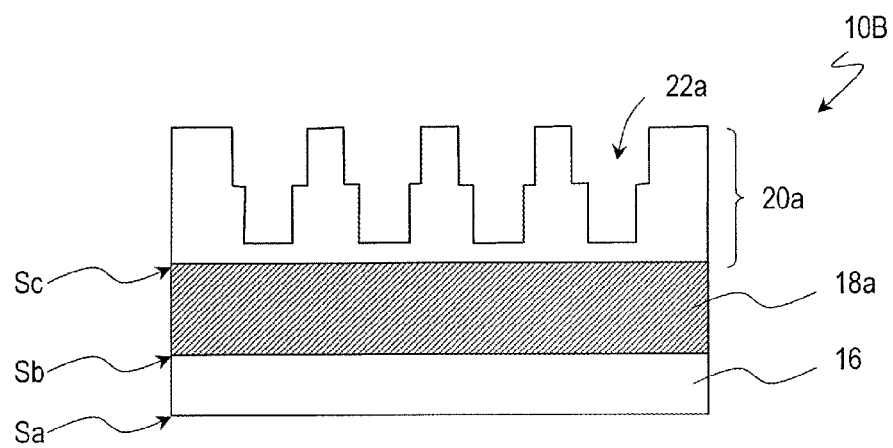
Figure 2:
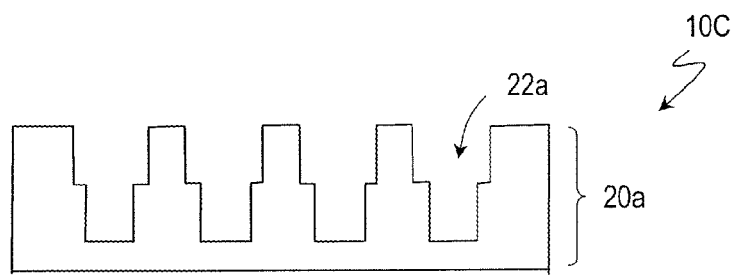
Figure 2:
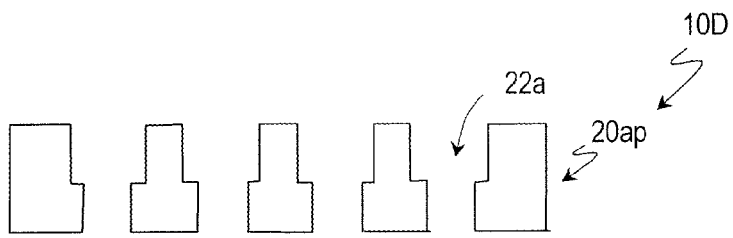

The multilayer structure of Experiment Example 2 has the same configuration as that of the multilayer structure 10 shown in FIG. 2. Specifically, the multilayer structure of Experiment Example 2 includes the plastic film 12, the inorganic underlayer 14 provided on the surface of the plastic film 12, the sacrificial layer 16 which is provided on the inorganic underlayer 14 and which contains aluminum, and the Al layer 18 provided on the surface of the sacrificial layer 16. Note that, when an electrically-conductive layer (preferably, a valve metal layer) is provided as a backing in order to uniformly anodize the Al layer 18 as is when the glass substrate 12 is used, the electrically-conductive layer is preferably provided between the inorganic underlayer 14 and the sacrificial layer 16 or between the sacrificial layer 16 and the Al layer 18. To prevent occurrence of electrochemical corrosion, the electrically-conductive layer is preferably made of a material which has a small difference in standard electrode potential from aluminum, such as titanium, magnesium, or the like. Titanium is known to have the effect of improving adhesion.

In Experiment Example 2, the plastic film 12 used was a PET (polyethylene terephthalate) film (manufactured by KIMOTO CO., LTD., 188 μm thick). On the PET film, a 70 nm thick $SiO_2$ layer was formed as the inorganic underlayer 14, and a 150 nm thick aluminum oxide monolayer (oxygen content: 30 at %) was formed as the sacrificial layer 16. Thereafter, a 1 μm thick Al layer 18 was formed. A series of these steps were carried out in the same way as in Experiment Example 1.

The multilayer structure of Comparative Example 3 has the same structure as that of the multilayer structure 30A shown in FIG. 4(a). The multilayer structure of Comparative Example 3 was fabricated according to the multilayer structure fabrication method used in the above experiment example except that the sacrificial layer 16 was not formed, and instead, the inorganic underlayer 34 was formed of $SiO_2$ on the plastic film (PET film) 12 before the formation of the Al layer 18.

The multilayer structure of Comparative Example 4 has the same structure as that of the multilayer structure 30B shown in FIG. 4(b). The multilayer structure of Comparative Example 4 was fabricated according to the multilayer structure fabrication method used in the above experiment example except that the inorganic underlayer 14 was not formed, and instead, a sacrificial layer 36 which was the same as the above was formed on the plastic film (PET film) 12 before the formation of the Al layer 18.

The adhesive property between the plastic film 12 and the Al layer 18 was evaluated in the same way as described above at a time immediately after the formation of the Al layer 18 and at a time after immersion in a phosphoric acid aqueous solution (1M, 30° C.) for 30 minutes. As for the multilayer structure 30A of Comparative Example 3, both the result of evaluation immediately after the formation of the film and the result of evaluation after the immersion in the phosphoric acid aqueous solution were "X", i.e., the adhesive property was poor. As for the multilayer structure 30B of Comparative Example 4, the result of evaluation immediately after the formation of the film was "Δ", but the result of evaluation after the immersion in the phosphoric acid aqueous solution was "X". As opposed to these cases, as for the multilayer structure 10 of Experiment Example 2, both the result of evaluation immediately after the formation of the film and the result of evaluation after the immersion in the phosphoric acid aqueous solution were "○", i.e., the adhesive property was excellent.

Figure 5:
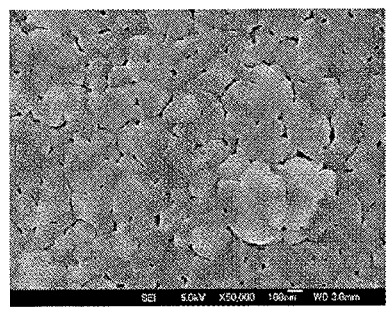
[FIGS. 5] (a) and (b) show SEM images of a surface of an aluminum layer of the multilayer structure 10 of Experiment Example 2 (a) shows a SEM image immediately after formation of the aluminum layer (b) shows a SEM image after immersion in a phosphoric acid aqueous solution.
Figure 5:
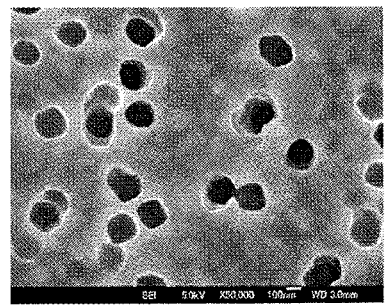
Figure 6:
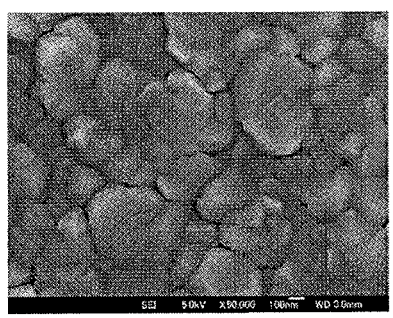
[FIGS. 6] (a) and (b) show SEM images of a surface of an aluminum layer of the multilayer structure 30A of Comparative Example 3 (a) shows a SEM image immediately after formation of the aluminum layer (b) shows a SEM image after immersion in a phosphoric acid aqueous solution.
Figure 6:
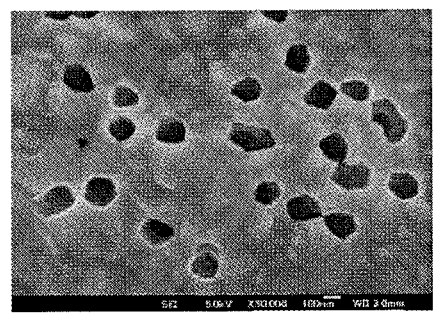
Figure 7:
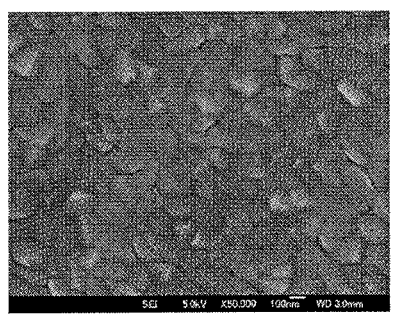
[FIGS. 7] (a) and (b) show SEM images of a surface of an aluminum layer of the multilayer structure 30B of Comparative Example 4 (a) shows a SEM image immediately after formation of the aluminum layer (b) shows a SEM image after immersion in a phosphoric acid aqueous solution.
Figure 7:
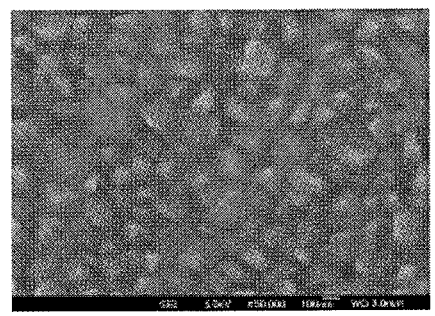

FIGS. 5(a) and 5(b) show SEM images of the surface of the Al layer 18 of the multilayer structure 30A of Comparative Example 3. FIGS. 6(a) and 6(b) show SEM images of the surface of the Al layer 18 of the multilayer structure 30B of Comparative Example 4. FIGS. 7(a) and 7(b) show SEM images of the surface of the Al layer 18 of the multilayer structure 10 of Experiment Example 2. In FIG. 5 to FIG. 7, (a) shows a SEM image of the Al layer 18 which was taken immediately after the formation of the aluminum layer 18. (b) shows a SEM image of the Al layer 18 which was taken after immersion in the phosphoric acid aqueous solution.

Small black spots which are seen in FIG. 5(a) are pits (recesses). It is seen from FIG. 5(b) that the pits were enlarged by immersion in the phosphoric acid aqueous solution.

It is seen from the comparison of FIGS. 6(a) and 6(b) with FIGS. 5(a) and 5(b) that the pits of the multilayer structure 30B of Comparative Example 4 were smaller both in number and size than the pits of the multilayer structure 30A of Comparative Example 3.

Thus, if the Al layer 18 has pits, the phosphoric acid aqueous solution enters through the pits to deteriorate the adhesive property with the plastic film 12 or the inorganic underlayer 34.

On the other hand, as clearly seen from FIGS. 7(a) and 7(b), a recess (pit) was not found in the Al layer of the multilayer structure 10 of Experiment Example 2, and the crystal grains of the Al layer of the multilayer structure 10 were smaller than those of the Al layers of the multilayer structures of Comparative Examples 3 and 4. Therefore, it is seen that a dense Al layer was obtained. Thus, when the aluminum oxide layer 16 is provided, a dense Al layer 18 which does not have a pit can be obtained, so that the adhesive property can be improved.

Although the sacrificial layer 16 used herein was formed by a single aluminum oxide layer, the sacrificial layer 16 may be formed by a plurality of aluminum oxide layers as previously described with respect to Experiment Example 1 when the plastic film 12 is used. For example, the sacrificial layer 16 was formed by three aluminum oxide layers, the first aluminum oxide layer provided on the inorganic underlayer 14 side in which the oxygen content was 60 at %, the second aluminum oxide layer provided on the Al layer 18 side in which the oxygen content was 1 at %, and the third aluminum oxide layer interposed between the first and second aluminum oxide layers in which the oxygen content was asymptotically gradient. In this case, the obtained results were excellent and were equal to or better than those of Experiment Example 2.

According to an embodiment of the present invention, as a matter of course, the Al layer may be formed on any plastic base which is different from the above-described plastic film.

EXPERIMENT EXAMPLE 3

In Experiment Example 3, an AlOx layer was formed as the sacrificial layer 16 as in Experiment Example 1, in which the aluminum concentration continuously varied such that it was higher in a portion which was closer to the Al layer 18a. The relationship between the thickness of the AlOx layer and the oxygen content in the AlOx layer and the adhesive property was examined. The glass substrate 12 used was a 2.8 mm thick soda lime glass substrate, which was the same as in Experiment Example 1. A $SiO_2$ layer 14 having a thickness of about 100 nm was directly formed on the surface of the glass substrate 12. The oxygen content in the AlOx layer was determined such that it was 0 at % on the $SiO_2$ layer 14 side and 100 at % on the Al layer 18 side and that the oxygen content linearly increased between these values. Such an AlOx layer was realized by controlling the flow rate of oxygen during the sputtering. The oxygen content was measured by X-ray photoelectron spectroscopy (ESCA). A 1 μm thick Al layer 18 was formed subsequent to formation of the sacrificial layer 16.

Evaluation of the adhesive property was performed as follows. The resultant multilayer structure 10 was cut into a matrix of 10×10 squares, each having a size of 1 mm×1 mm, using a utility knife, with the incision reaching the surface of the glass substrate 12. An adhesive tape (Scotch tape BH-24 manufactured by Sumitomo 3M Limited) was tightly placed onto the Al layer 18 so as to cover a region of the cut squares and then peeled off from the Al layer 18. The number of squares (including the Al layer 18, the inorganic underlayer 14 and/or the sacrificial layer 16) which were removed together with the peeled adhesive tape was counted for evaluation. The evaluation was made with the classification into 10 grades according to the number of unremoved squares: "0" means that all the squares were removed; and "10" means that all the squares remained unremoved. The results are shown in TABLE 3. Note that, in TABLE 3, the oxygen content in the AlOx layer refers to the average oxygen content in the AlOx layer.

TABLE 3

| | | Oxygen content in $AlO_x$ film (at %) | | | | |
|---|---|---|---|---|---|---|
| | | 0 | 10 | 20 | 30 | 40 |
| $AlO_x$ film thickness (nm) | 0 | 0 | — | — | — | — |
| | 10 | 1 | 1 | 1 | 1 | 1 |
| | 20 | 1.5 | 1.5 | 1.5 | 2 | 2 |
| | 40 | 2 | 2 | 2.5 | 3 | 3 |
| | 50 | 2 | 2 | 4 | 5 | 6 |
| | 100 | 2 | 3 | 5 | 5 | 6 |
| | 120 | 2 | 3.5 | 5 | 5 | 6 |
| | 150 | 2 | 3.5 | 5 | 6 | 7 |
| | 180 | 2.5 | 3.5 | 5.5 | 6 | 7 |
| | 200 | 2.5 | 4 | 6 | 8 | 10 |
| | 300 | 2.5 | 4 | 6 | 8 | 10 |
| | 500 | 2 | 5 | 7 | 10 | 10 |

As seen from TABLE 3, the adhesive property of the AlOx layer can be controlled by regulating the thickness of the AlOx layer and the oxygen content in the AlOx layer.

Figure 8:
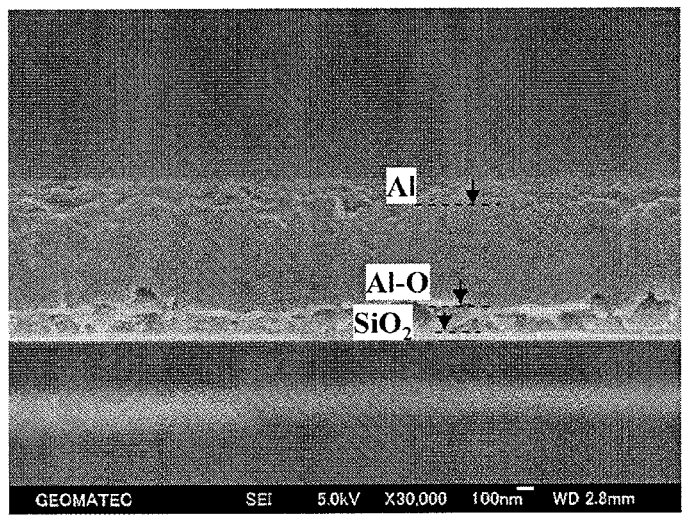
[FIG. 8] (a) shows a cross-sectional SEM image of the multilayer structure 10 of an experiment example (b) shows a cross-sectional SEM image of the multilayer structure 10A which was obtained after the anodization process and the etching process were performed on the multilayer structure 10. (c) shows an enlarged SEM image of a portion which is encircled with a broken circle in (b).
Figure 8:
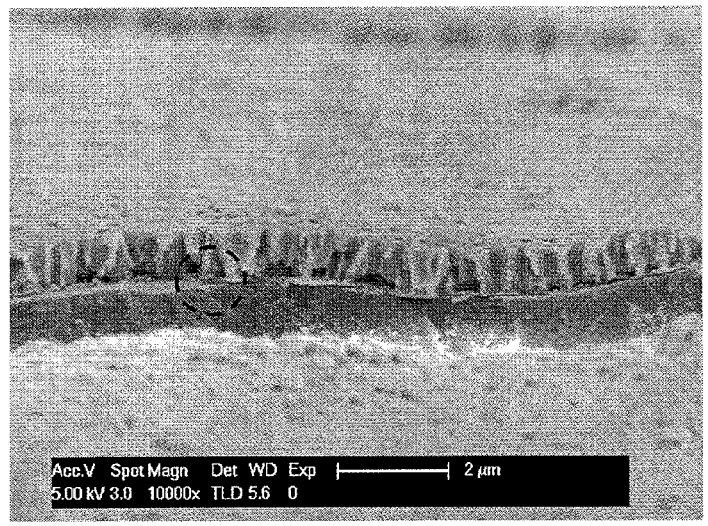
Figure 8:
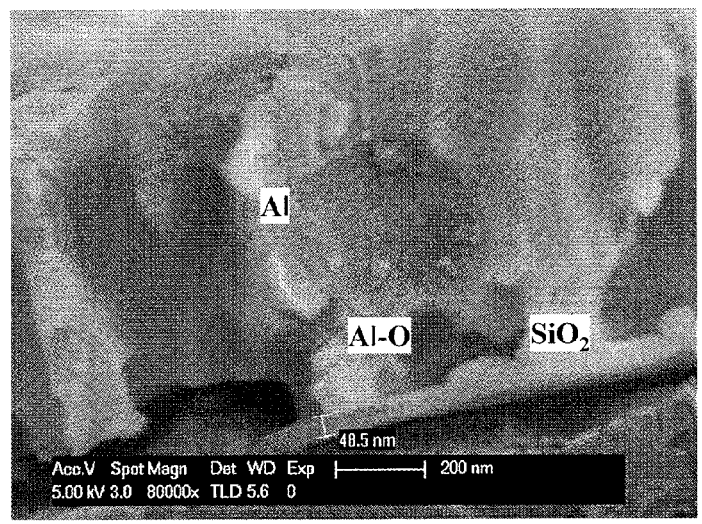

FIG. 8(*a*) shows a cross-sectional SEM image of a multilayer structure 10 that included a $SiO_2$ layer 14 having a thickness of about 100 nm on the glass substrate 12, an AlOx layer 16 (oxygen content: 10 at %) having a thickness of about 150 nm, and an Al layer 18 having a thickness of about 1 μm. FIG. 8(*b*) shows a cross-sectional SEM image of a multilayer structure 10A (see FIG. 2(*a*)) which was obtained after the anodization step and the etching step were alternately performed on the multilayer structure 10 (under the same conditions as those of Experiment Example 1 for either step) through seven cycles (including four cycles of the anodization step and three cycles of the etching step). FIG. 8(*c*) shows an enlarged SEM image of a portion which is encircled with a broken circle in FIG. 8(*b*).

As seen from FIG. 8(*a*), the multilayer structure 10 formed includes the $SiO_2$ layer 14, the AlOx layer 16, and the Al layer 18. As seen from FIG. 8(*b*) and FIG. 8(*c*), the AlOx layer 16 was damaged through the anodization step and the etching step, and the contact area of the interface between the AlOx layer 16 and the underlying $SiO_2$ layer 14 was reduced.

As exemplified herein, considering a case where the anodization step and the etching step are alternately performed through a plurality of cycles, if the conditions are within the hatched ranges of TABLE 3, specifically if the conditions are such that the thickness of the AlOx layer is not less than 50 nm and not more than 150 nm and that the oxygen content is not less than 10 at % and not more than 30 at %, the Al layer would not peel off during the anodization step and the etching step and, after having undergone the anodization step and the etching step, the porous alumina layer 20*a* can be readily separated by the above-described method.

The inorganic underlayer may be a titanium oxide layer or a silicon nitride layer. The sacrificial layer may be a layer which contains aluminum and nitrogen. The treatment solution that is used for removing these layers may be appropriately selected from known treatment solutions.

In the above-described example, soda glass was used as the material of the glass substrate. However, Pyrex glass, Tempax glass, or quartz glass may be used instead. These glass materials are commonly characterized in that the amount of alkali dissolved away therefrom is small as seen from TABLE 4. Therefore, when any of these glass materials is used for the base 12, the above-described inorganic underlayer may be omitted. In that case, the sacrificial layer 16 functions to reduce the stress which is attributed to the difference in thermal expansion coefficient between the base and the Al layer, thereby improving the adhesive property.

TABLE 4

| Glass material | Expansion coefficient ($\alpha \times 10^{-7}/°$ C.) | Amount of alkali dissolved away ($Na_2Omg$) |
|---|---|---|
| Soda lime | 87 | 0.37 |
| Pyrex | 32 | 0.01 |
| Tempax | 32 | 0.01 |
| Quartz | 5 | 0.00 |

A self-supporting anodized film which is obtained by an anodized film manufacturing method of an embodiment of the present invention is applicable to various uses. For example, an anodized film which has through holes can be used as an electrolyte film for use in fuel cells when the through holes are charged with an electrolyte. When the recessed portions or through holes are charged with a magnetic material, the anodized film can form a magnetic storage medium. As a matter of course, the anodized film can form an optical element, such as an antireflection film. Further, by the utilization of regularly-arranged through holed or recessed portions, DNA or the like can be regularly arranged. Furthermore, an anodized film which has through holes can be used as a precise separation filter. Furthermore, the anodized film can be used for a heat radiation element, a thermoelectric element, or the like, of which the large surface area is utilized.

INDUSTRIAL APPLICABILITY

The present invention is used for manufacture of a self-supporting anodized film which is applicable to various uses.

REFERENCE SIGNS LIST 10 multilayer structure
10C, 10D, 20C, 20D self-supporting anodized film
12 base (glass substrate) or plastic film (plastic substrate)
14, 34 inorganic underlayer
16, 36 sacrificial layer
18, 18*a* aluminum layer (Al layer)
20, 20*a*, 20*b* porous alumina layer
20*ap*, 20*bp* porous layer
20*ab*, 20*bb* barrier layer
22, 22*a*, 22*b* micropores, recessed portions, or through holes

The invention claimed is:
1. A method for manufacturing an anodized film, comprising the steps of:
 (a) providing a multilayer structure that includes an inorganic or plastic base, a sacrificial layer which is provided on the base and which contains aluminum, and an aluminum layer which is provided on a surface of the sacrificial layer;

(b) partially anodizing the aluminum layer to form a porous alumina layer which has a plurality of minute recessed portions; and
(d) after step (b), separating the porous alumina layer from the multilayer structure,
wherein the anodized film is a self-supporting film which includes the porous alumina layer, and wherein
the sacrificial layer contains aluminum and either of oxygen or nitrogen, and
the sacrificial layer has a profile such that a content of the aluminum is higher in a portion which is closer to the aluminum layer than in another portion which is closer to the base.

2. The method of claim 1, wherein
the multilayer structure further includes an inorganic underlayer which is provided on a surface of the base, and
the sacrificial layer is provided on the inorganic underlayer.

3. The method of claim 1, further comprising step (c) of, after step (b), bringing the porous alumina layer into contact with an etching solution.

4. The method of claim 3, wherein step (c) includes
(c1) bringing the porous alumina layer into contact with an etching solution to enlarge the plurality of minute recessed portions of the porous alumina layer, and
(b1) after step (c1), further performing anodization to grow the plurality of minute recessed portions.

5. The method of claim 1, further comprising step (e) of, after step (d), removing the aluminum layer and/or the sacrificial layer adhered to the porous alumina layer.

6. The method of claim 5, further comprising step (f) of, after step (e), removing a barrier layer of the porous alumina layer.

7. The method of claim 1, wherein the porous alumina layer has a plurality of recessed portions or through holes whose diameter is not less than 10 nm and less than 500 nm.

8. The method of claim 2, wherein the inorganic underlayer is a silicon oxide layer or a titanium oxide layer.

9. The method of claim 1, wherein the sacrificial layer is between the base and the aluminium layer.

* * * * *